United States Patent [19]

Greig

[11] 4,101,830
[45] Jul. 18, 1978

[54] MERCURY PROBE
[75] Inventor: John H. Greig, Massapequa, N.Y.
[73] Assignee: MSI Electronics Inc., Woodside, N.Y.
[21] Appl. No.: 768,824
[22] Filed: Feb. 15, 1977
[51] Int. Cl.² ............... G01R 1/06; G01R 31/22; H01R 3/04
[52] U.S. Cl. ............... 324/158 F; 324/158 P; 339/118 R
[58] Field of Search ............ 324/158 F, 158 P, 72 S; 339/117 R, 117 P, 118 R

[56] References Cited
U.S. PATENT DOCUMENTS 3,345,567  10/1967  Turner et al. ............... 324/158 P
3,794,912  2/1974   Severin et al. ............... 324/158 P Primary Examiner—Rudolph V. Rolinec
Assistant Examiner—Ernest F. Karlsen

[57] ABSTRACT

The disclosed apparatus provides a mercury electrode for making non-destructive tests, especially for Schottky-diode tests of semi-conductors such as silicon. By developing vacuum under a test wafer on a support, a column of mercury is drawn into contact with the test wafer through a bore in the support that accurately establishes the area of the contact. The vacuum system also holds the test wafer securely in position, it avoids spillage of mercury, and additional circuit-completing contact can be made to the wafer with independently controlled pressure.

11 Claims, 2 Drawing Figures

MERCURY PROBE

This invention relates to apparatus including a mercury electrode for making contact with a test wafer, for non-destructive evaluation tests.

It has long been known that a mercury contact can be used in making evaluation tests of certain properties of a semi-conductor sample. For example, a mercury contact to a semi-conductor surface constitutes an electrode producing a Schottky diode. Schottky diode tests are useful in evaluating semi-conductor properties, non-destructively. A mercury contact is also useful as an electrode in making other non-destructive tests such as capacitance tests on oxide-coated material and resistance tests. An object of the present invention resides in providing novel apparatus including a mercury column as an electrode for testing semi-conductor wafers and insulating layers and for resistance tests.

A further object resides in provision of novel apparatus of this kind having features for safeguarding the mercury against escape.

A further object resides in the provision of novel apparatus of this kind wherein the desired area of the mercury electrode can readily be determined selectively.

A further object of the invention resides in provision of means for developing a reproducible relatively uniform sub-atmospheric pressure in the interface between the wafer and its supporting surface at and about the mercury electrode.

A still further object of the invention resides in the provision of novel apparatus wherein a test wafer is securely held in position for test while it is engaged by the mercury electrode, and wherein circuit-completing contact is made to the test wafer with independently established contact pressure.

These and other objects and advantages of the invention are achieved in the illustrative embodiment of the invention described in detail below and shown in the accompanying drawing. The illustrative apparatus includes a support for a test wafer, the support having two ports, one of which leads to a mercury reservoir and the other to a vacuum system. The vacuum can be turned on and off for bringing the mercury electrode into contact with the wafer and for interrupting the contact. Despite its great surface tension, the mercury becomes flattened against the wafer to form an electrode whose area is limited by the orifice in the support. Various sizes of orifices can be selected for selecting different electrode areas by changing the orifice plate or by selectively aligning one of various orifices in an orifice plate with the orifice in a vacuum chuck through which the mercury column is drawn when vacuum is turned on. The test wafer should fit flush against the orifice plate, with a clearance too small to allow spreading of the mercury beyond the outline of the orifice. The mercury column does not rise in the absence of the test wafer, providing an automatic safeguard against spillage of the mercury. Even in the event of excessive clearance between the test wafer and the orifice plate, when some mercury could leave the orifice and enter the vacuum system, it would be trapped and contained against escape. The wafer is drawn against the orifice plate and held securely in test position by the same vacuum that induces the mercury column to rise. The wafer is not pressed upward bodily by the mercury column, so that regulated pressure of one or more contacts to the opposite face of the wafer can be established independently.

For dependable and reproducible development of sub-atmospheric pressure at the orifice where the mercury contacts the wafer, means is provided for developing vacuum in the interface between the wafer and the supporting surface at points, or preferably in a continuous loop, about the orifice.

A "return" contact is made to the wafer to act with the mercury electrode in providing a test-current path. This return contact is required to be ohmic in certain evaluations, and it is ordinarily made to the face of the wafer opposite the face engaged by the mercury. However, some wafers to be tested have a prepared oxide layer on the face opposite the mercury electrode. For this or other reasons, the return contact may be made to the same face of the wafer as that engaged by the mercury. In that event, the wafer itself may bear metal-film connections, or suitable contacts such as leaf-spring contacts may be built into the wafer support. Such contacts may be incorporated in the orifice plate when used as the wafer support. In the preferred embodiment described in detail below, the contact that provides a current path through the wafer from the mercury electrode is established by a resilient contact carried by an arm that is movable toward the wafer to make contact, and movable away from the wafer support to facilitate positioning and removal of the wafers to be tested. The arm carries an additional contact useful for testing the linearity of the return contact when the test requires the return contact to be ohmic, and for pulsing the return contact to improve its linearity if necessary.

The foregoing and other objects and novel features of the invention will be recognized and better appreciated from the following detailed description of the illustrative embodiment, which is shown in the accompanying drawings.

Figure 1:
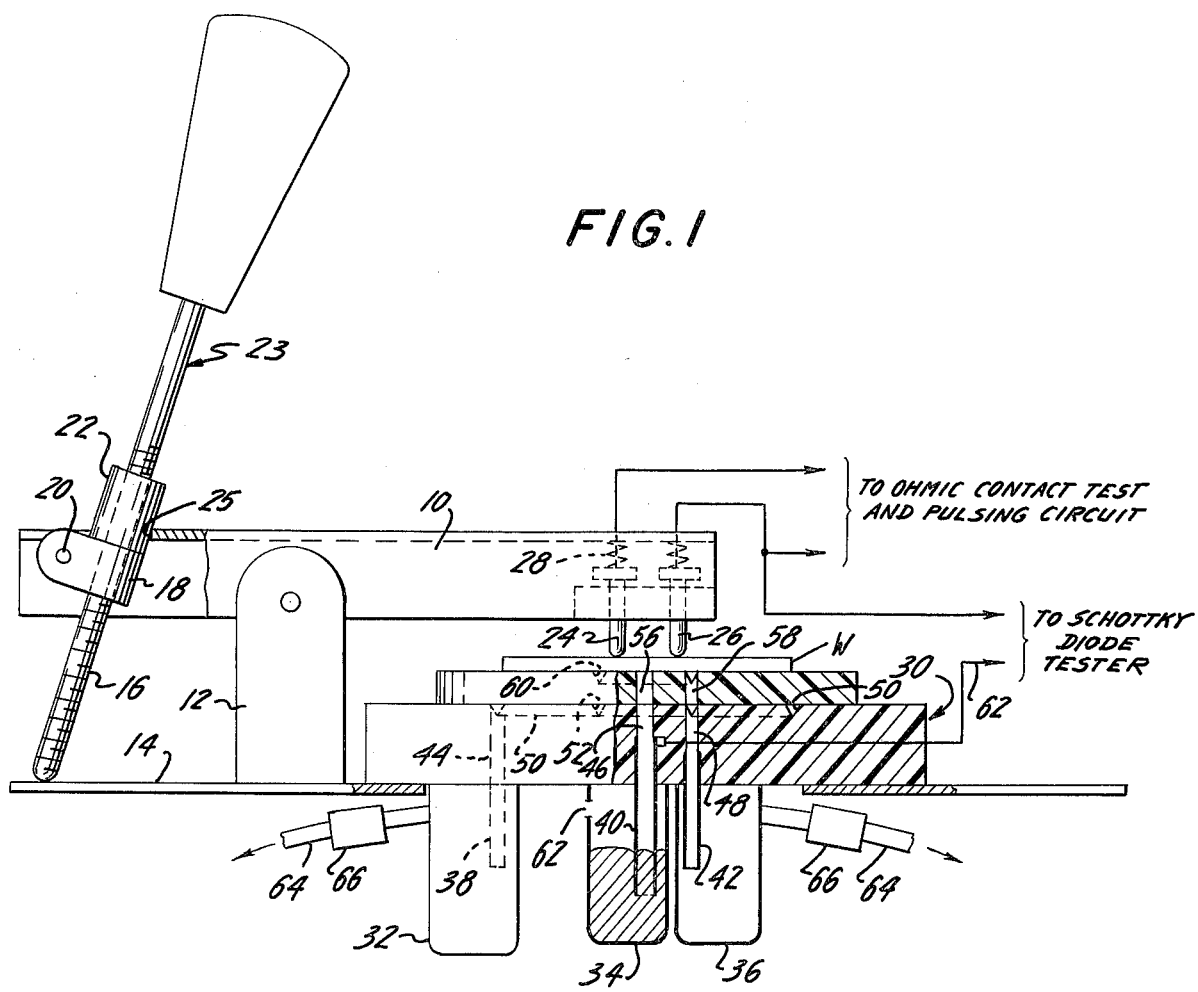
FIG. 1 is a somewhat diagrammatic lateral view, partly in cross-section, of novel contact making apparatus, constituting an embodiment of the invention.
Figure 2:
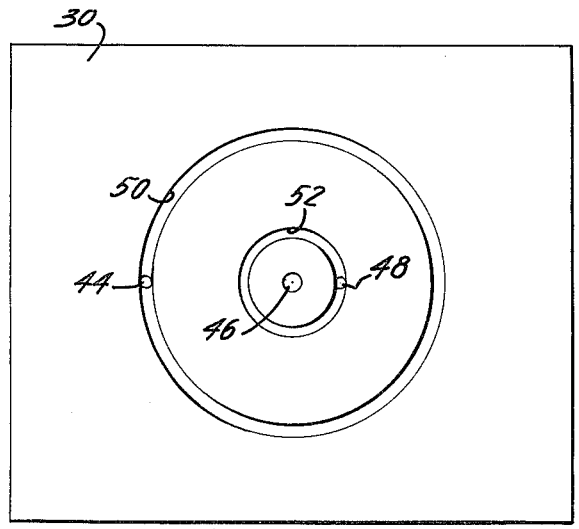
FIG. 2 is the top plan view of a component part of the apparatus of FIG. 1.

In FIG. 1, an arm 10 is formed generally as an inverted channel. It is pivoted to a yoke 12 on base plate 14. Threaded shaft 16 is received in a threaded bore in member 18 which is carried by pivot 20 in side flanges of arm 10. An internally threaded and externally knurled lock-nut 22 on shaft 16 secures shaft 16 in its desired adjustment. The end of member 18 remote from pivot 20 is rounded, having the same radius as lock-nut 22 about the axis of shaft 16. Member 18 and lock-nut 22 are received in a slot in the top wall of arm 10. In the position shown, lever 23 (comprising shaft 16, member 18 and lock-nut 22) bears against stop 25.

At the right-hand end of arm 10 there is a contact assembly including contacts 24 and 26 that slide in bores in insulating block 28. These contacts are biased downward by diagrammatically illustrated springs that are suitably insulated from arm 10 and which provide separate electrical connections from the contacts to external circuits. The length of shaft 16 is adjusted to bear against base plate 14 and thereby lock or latch arm 10 in the position shown with contacts 24 and 26 in resilient contact with test wafer W. When shaft 16 is swung counterclockwise about pivot 20, arm 10 is lifted away from wafer W.

A chuck 30 which may be a plate of phenolic insulation for example rests on base plate 14, and is held in position by pins (not shown). Three glass vials 32, 34 and 36 are secured by caps to chuck 30 making air-tight connections. Tubes 38, 40 and 42 are fixed in chuck 30 and project into the vials. These tubes are of stainless steel, in an example, or of other suitable material that does not form an amalgum with mercury. These tubes are aligned with corresponding bores 44, 46 and 48 through chuck 30. A circular groove 50 of large diameter communicates with bore 44. Groove 52 of smaller diameter communicates with bore 48. These grooves are concentric about central bore 46 that communicates with tube 40.

Resting on chuck 30 is an orifice plate 54 penetrated by a central bore 56 and by another bore 58. The lower end of the latter opens into circular groove 52 of the chuck, while the upper end of bore 58 opens into circular groove 60 in the top surface of the orifice plate. Orifice plate 54 is of insulating material such as glass or a plastic such as an acrylic or polycarbonate.

Vial 34 is a mercury reservoir. A small port 62 in its lid communicates to the atmosphere. Vials 32 and 36 have lines 64 extending through respective constrictions 66 to a vacuum pump (not shown) that provides for one-half atmosphere of vacuum, for example.

When a wafer of semiconductor such as silicon or gallium arsenide is to be tested, an orifice plate 54 is selected having a desired diameter of bore 56 of about 0.51 mm to 1.02 mm diameter. The lower face of plate 54 has a limited clearance from chuck 30 within groove 50 to enable the vacuum in bore 44 to act over a sufficient area to draw the orifice plate firmly against the chuck. A clearance of 10 to 100 microns is suitable.

As a preliminary procedure, a microscope slide may be placed on orifice plate 54 in place of wafer W. With the vacuum "on", mercury in vial 34 should rise to bear against the slide via tube 40, bore 46 and bore 56. There should be a good fit of the flat microscope slide against the flat upper surface of the orifice plate, such that the mercury in orifice 56 does not spread outside the bore diameter. If spreading occurs, then there may be dust on the orifice plate and it should be cleaned. If the mercury does not reach the slide, then the vacuum is inadequate. The fit of orifice plate 54 against chuck 30 may be such as to allow limited spreading of the mercury between the chuck and the orifice plate, an effect that can be observed where the orifice plate is transparent. In case of excess clearance between the chuck and the orifice plate, cleaning may be needed. Any mercury that is drawn away from bores 46 and 56 by vacuum due to abnormal conditions becomes trapped in vials 32 and 36.

A wafer W to be tested is then placed on orifice plate 54 and the vacuum is turned on. This causes the mercury to rise into contact with the wafer but at the same time it draws the wafer securely against the orifice plate. The mercury does not rise even with vacuum "on" if the wafer is absent. This arrangement inherently prevents accidental escape of the mercury, and it holds the wafer in stable position for independently adjustable light pressure engagement by additional contacts.

Shaft 16 is swung into the position shown to move the contact arm down and to bring contacts 24 and 26 into engagement with the wafer. One of the two contacts 24 and 26 will serve as the return contact in checking the Schottky-barrier contact made by the mercury column. The other of these two contacts is provided for checking the linearity of the return contact in case ohmic contact is required, and for pulsing the return contact to improve linearity. The circuit through contacts 24 and 26 and the wafer is checked to make sure that the contact engagement with the wafer is non-rectifying near zero volts, using a curve tracer in making this test. One or more pulses through these contacts may be needed to break down an oxide layer on the surface of the wafer causing any non-linearity. After ohmic contact to the upper surface of wafer W is established, and with the vacuum turned "on" to bring the mercury into contact with the wafer, the curve tracer is connected to the circuit including the mercury column and one of the contacts 24, 26 to show the rectifying characteristic of the semiconductor. If there is excessive leakage or if the diode characteristic is unsatisfactory for any other reason, the wafer can be moved to a slightly different position, and the foregoing procedure repeated. Once the I-E characteristic is satisfactory, RF measurements can be made.

The diode formed at the mercury contact can now be biased and the capacitance, for example, can be measured. With the vacuum turned "on", the diode capacitance may be measured in a preliminary procedure for checking the mercury electrode. The vacuum may now be turned off. When it is turned "on" again, the capacitance should return to the same value measured before the vacuum was turned off, within a few pico-farads. If not, there may be dirt or mercury oxide on the mercury in the siphon. This condition may be corrected by removing a small quantity of mercury from the surface. The wafer can be replaced by a glass plate (not shown) having a groove from the center orifice 56 to groove 60 of the orifice plate. The vacuum is then turned on briefly, causing some mercury to rise in the center hole and to be transported via the groove in the glass plate to vial 36. If this procedure proves unsuccessful, the mercury passages of the apparatus may need cleaning to remove grease, or a new supply of clean mercury may be needed. Instability of the capacitance reading may also be caused by moisture on the sample. This may sometimes be eliminated by leaving the wafer in place with the vacuum turned on, long enough for the surface to dry out.

With stable conditions assured, dependable Schottky diode measurements can be made. Turning the vacuum off should cause the capacitance reading to go to zero. By setting the capacitance reading of the test instrument to zero, most of the wiring capacitance is eliminated from subsequent capacitance readings. Routine measurements with the vacuum "on" may then proceed, to perform non-destructive evaluation tests of the semiconductor wafer.

The use of orifice plate 54 has several advantages. It is readily replaceable (as indicated above) to provide the desired area of mercury contact. Additionally, it is replaceable in case it becomes scratched. However, if these advantages of a separate orifice plate are not regarded important, then the wafer to be tested may be supported directly on chuck 30.

The configuration of the orifice plate involving passage 58 and groove 60 is optional. A cluster of holes additional to contact-area-defining bore 56 may be used instead. Such holes may be of special advantage in testing small samples of semiconductor. In addition, a number of holes of different accurately determined sizes may be provided in one orifice plate, and the desired hole can be aligned selectively with bore 46 for selecting the desired contact area of the mercury. Notably, the changeable or movable orifice plate is useful not only in apparatus having a vacuum system for raising the mercury column, but with other such systems.

Groove 50, passage 44 and vial 32 is an optional arrangement to enable vacuum to be maintained for holding the orifice plate securely in position with its "center" orifice 56 in alignment with the mercury-column orifice 46 of chuck 30. Vacuum may be maintained in these passages when the vacuum to passages 48 and 58 is turned on and off in the operations described above.

It is not necessary for passage 58 in the orifice plate to be aligned with passage 48 in the chuck. These two passages can be displaced from each other provided that the interface between the opposed surfaces of the orifice plate and the chuck has limited clearance for completing the passage for air between passages 48 and 58. In any case, the aperture plate must extend over both passages 46 and 48 of the chuck.

Controlled clearance at the interface between the chuck and the orifice plate, and between the orifice plate and the wafer, can be achieved by careful attention to making the faces of these elements flat and by developing a suitable finish on these faces, in terms of micro-inches. If the surface finish is theoretically perfect, of course there will be no air passage for developing vacuum to raise the mercury column. To sustain the vacuum at a stable level, the surface finish should not be too crude. Moreover, grooves from the mercury-column bores 46 and 56 across the flat faces to the periphery of orifice plate 54 or to the periphery of the test wafer should be avoided. This is easily achieved by using an orbital motion in the use of abrasive when developing the desired surface finish.

It may be useful to consider the functions of grooves 50, 52 and 60. When the mercury is raised into contact with the wafer, the sub-atmospheric pressure at the mercury contact area is theoretically equal to the sub-atmospheric pressure present at the groove 60, since there is no longer any air flow from the mercury contact area. Groove 60 surrounding the aperture formed by bore 56 creates a zone of uniform pressure in the interface between the wafer and the orifice plate. Groove 52 is always aligned with passage 58 since both grooves are centered at the axis of the mercury column. This arrangement of grooves 52 and 60 and port or passage 58 is not critical since vacuum would be developed despite some misalignment. The overall effect of the described air passages is to ensure consistency in the vacuum at the area of contact of the mercury against the wafer. Due to the high surface tension of mercury, there is a slight rounding of the mercury at the periphery of the orifice, making the mercury contact area very slightly less than the orifice area. This rounding of the mercury is influenced by the vacuum at the contact area, usually a second-order effect. A configuration of the vacuum passages that ensures development of a uniform consistent sub-atmospheric pressure at the mercury contact area thus contributes to consistency of test results. A zone of uniform vacuum is developed in the area within groove 50, largely unaffected by leakage of air from the periphery of the orifice plate to that groove; and as a result there is greater assurance of a uniform, consistent vacuum being developed at and within groove 52. It is evident that groove 60 may be replaced by a series of holes 58 in a circle aligned or nearly aligned with groove 52 would serve the same purpose as a single port 58 used with groove 60 in the described embodiment.

Further modifications and varied application of the illustrative apparatus described above will be readily apparent to those skilled in the art. Consequently, the invention should be construed broadly in accordance with its true spirit and scope.

What is claimed is:

1. Electrical test apparatus, including means for supporting a test wafer at the face thereof to be tested, the supporting means providing a wafer-engaging face, a reservoir of mercury below said supporting means, means providing a passage from the reservoir through at least part of said supporting means to the wafer-engaging face thereof for enabling the mercury to contact said test face of the wafer, said passage means terminating in an aperture in said wafer-engaging face accurately determining an area of contact of the mercury to a wafer on said wafer-engaging face, said supporting means providing electrical insulation between the wafer and the mercury that contacts the wafer during use of the apparatus except for said determined contact area, means for developing a vacuum in the interface between the wafer-engaging face of said supporting means and the wafer near and at said aperture for drawing mercury from the reservoir to said contact area and for holding the wafer against said wafer-engaging face.

2. Electrical test apparatus according to claim 1, wherein said supporting means includes a chuck and a separate orifice plate on the chuck, a surface of said orifice plate providing said wafer-engaging face, said chuck and said orifice plate having aligned bores forming at least part of said passage means from the mercury reservoir to the wafer-engaging face, at least said orifice plate having a bore additional to said aligned bores providing part of said means for developing vacuum in the interface between the wafer-engaging face of said orifice plate and the wafer.

3. Electrical test apparatus according to claim 2, including further means for developing vacuum in the interface between the chuck and the orifice plate to hold the latter in position securely on the chuck.

4. Electrical test apparatus according to claim 1, including an arm carrying at least one resilient contact, said arm being movable between one position for making contact with the wafer and another position remote from the wafer, and means for latching the arm in said contact-making position for establishing desired engagement of said resilient contact to a wafer on the supporting means.

5. Electrical test apparatus according to claim 4, wherein said arm carries an additional resilient contact for enabling observation of the voltage-current characteristic of the engagement of the wafer with said one resilient contact and for enabling pulsing thereof for rendering the characteristic linear.

6. Electrical test apparatus according to claim 1, wherein said means for developing a vacuum in said interface includes air-passage means about said aperture for establishing a relatively uniform sub-atmospheric pressure at least in that portion of the interface closely adjacent to and surrounding the aperture.

7. Electrical test apparatus according to claim 1, wherein said means for developing a vacuum in said interface includes a groove in the wafer-engaging face surrounding said aperture, and wherein said means for developing a vacuum includes a vacuum port in the supporting means extending to said groove for establishing essentially uniform sub-atmospheric pressure in said interface about said aperture.

8. Electrical test apparatus according to claim 2, wherein said vacuum developing means includes means about the aperture in the orifice plate for establishing relatively uniform sub-atmospheric pressure about said aperture in the interface between the wafer and the orifice plate, said last-named means including a groove surrounding said mercury passage in at least one of said orifice plate and said chuck.

9. Electrical test apparatus including a support, an orifice plate on the support, said orifice plate having a flat surface for supporting a flat test wafer, said support and said orifice plate having aligned bores extending to an aperture in said flat surface, means for developing vacuum at the flat surface of the orifice plate at and near said aperture but only when a test wafer is disposed thereon for elevating mercury through said aligned bores to said aperture to form an electrode engaging a wafer on the orifice plate, said orifice plate being separably received on the support for providing a desired electrode area in the orifice plate.

10. Electrical test apparatus according to claim 9 wherein said flat surface of the orifice plate has a circular groove centered about said aperture and forming part of said vacuum developing means for establishing a relatively uniform sub-atmospheric pressure about said aperture.

11. Electrical test apparatus according to claim 10 including a second circular groove in the interface between said orifice plate and said support of the same diameter as said first-mentioned circular groove and centered about said aperture, said vacuum developing means including a bore through said orifice plate interconnecting said grooves, and further vacuum passage means through said support opening into said second circular groove.

* * * * *